United States Patent [19]

Ahlgren et al.

[11] Patent Number: 4,701,998
[45] Date of Patent: Oct. 27, 1987

[54] METHOD FOR FABRICATING A BIPOLAR TRANSISTOR

[75] Inventors: David C. Ahlgren, Hopewell Junction; Robert E. Bendernagel, Carmel; Russell C. Lange, Wappingers Falls; Martin Revitz, Poughkeepsie, all of N.Y.

[73] Assignee: International Business Machines Corporation, Armonk, N.Y.

[21] Appl. No.: 803,451

[22] Filed: Dec. 2, 1985

[51] Int. Cl.[4] .......................................... H01L 21/316
[52] U.S. Cl. ........................... 437/31; 148/DIG. 110; 148/DIG. 17; 156/653; 156/643; 437/186
[58] Field of Search ............. 29/571, 578, 580, 576 B; 156/655, 657, 643, 653; 148/DIG. 117, DIG. 17, DIG. 118, 187, 175

[56] References Cited

U.S. PATENT DOCUMENTS 4,305,760 12/1981 Trudel .................................. 148/1.5

OTHER PUBLICATIONS

Beyer et al., "Elimination of Stacking Faults" in *IBM Tech. Dis. Bull.*, vol. 19, No. 8, Jan. 1977, p. 3051.
Manzi et al., "RIE . . . " in *IBM Tech. Dis. Bull.*, vol. 25, No. 11A, Apr. 1983, pp. 85744–85745.
Lifshitz, N., "Study of Breakdown . . . " in *J. Electrochem. Soc.*, Jul. 1983, pp. 1549–1550.
Jackson, Jr., "Advanced Epitaxial Processes . . . ," in *Transactions of the Metallurgical Society of AIME*, vol. 233, Mar. 1965, pp. 596–602.

*Primary Examiner*—Brian E. Hearn
*Assistant Examiner*—T. N. Quach
*Attorney, Agent, or Firm*—Sughrue, Mion, Zinn, Macpeak and Seas

[57] ABSTRACT

A method for fabricating a bipolar transistor having a base doping variation of less than 20% is disclosed. A polysilicon base contact bipolar transistor is formed up to the point just prior to the intrinsic base-emitter formation. The intrinsic base-emitter opening is then reactive ion etched through the polysilicon base contact layer down to and into a single crystal silicon body thereunder, whereby the surface of the single crystal silicon is damaged. A silicon dioxide layer is then grown on the exposed and damaged single crystal silicon to convert the damaged silicon surface into a silicon dioxide layer. The silicon dioxide layer is removed by chemical etching to expose undamaged single crystal silicon. A screen silicon dioxide layer 50 to 500 Å±10%, e.g., 180 Å, is then formed on the thus exposed undamaged single crystal silicon. The intrinsic base region is then formed by ion implantation through the screen silicon dioxide layer, the emitter region is formed within the intrinsic base region and electrical contact is made to the various elements of the bipolar transistor.

6 Claims, 6 Drawing Figures

METHOD FOR FABRICATING A BIPOLAR TRANSISTOR

BACKGROUND OF THE INVENTION

1. Field of the Invention

The present invention relates to a method for fabricating a bipolar transistor.

2. DESCRIPTION OF THE PRIOR ART

Modern transistors such as bipolar transistors and other devices, whether they are fabricated using polysilicon base technology or conventional technology, use reactive ion etching to open or define regions on the silicon substrate that will be the emitter and base regions.

Transactions of the Metallurgical Society of AIME by Jackson, Jr., Vol. 233, March 1965, pp. 596–602 discloses that in fabricating a buried layer a p-type substrate can have a thermal oxide grown over its surface, and windows can then be etched through the oxide in a photoresist step. The oxide (10,000 Å) removes work-damaged material to the extent that after it is removed, and subsequent epitaxial layers are deposited over the exposed silicon, the stacking fault density in the epitaxial layer is low (less than 10 per sq.cm.).

U.S. Pat. No. 3,600,241 Doo et al deals with semiconductor device fabrication. After diffusion has been carried out at elevated temperatures through a $SiO_2$ or another diffusion barrier mask, the mask is stripped from the surface of the semiconductor substrate and a surface of the semiconductor substrate is reoxidized. According to Doo et al, this eliminates surface defects in the semiconductor substrate which tend to arise at the elevated temperatures and over the relatively long periods of time necessary for diffusion. Where an epitaxial layer is to be formed on the surface of the substrate, the oxide layer is first removed from the surface. According to Doo et al this reduces stacking faults in the epitaxial layer caused by surface irregularities in the substrate.

U.S. Pat. No. 3,929,529 Poponiak discloses a method for gettering (removing) fast diffusing metal contaminants from a monocrystalline silicon body by a process which comprises anodizing at least one side of the body in an aqueous liquid bath under conditions that result in the formation of a porous silicon surface layer, annealing the resultant structure in a nonoxidizing environment for a time sufficient to trap the contaminants from within the semiconductor body into the porous silicon layer, and exposing the body to an oxidizing environment to oxidize the porous silicon layer to $SiO_2$. The $SiO_2$ layer can be removed, thereby completely removing the contaminants from the wafer or can be retained on the device since the contaminants are effectively tied up in the layer.

J. of Electrochemical Soc., Lifshitz, July 1983, pp. 1549–50, discloses a method for improving breakdown fields of oxides grown on reactive ion etched silicon surfaces. Lifshitz suggests growth of a thin oxide layer and its chemical removal prior to gate oxidation.

Other prior art of interest includes U.S. Pat. No. 4,023,266 Lovell and IBM Technical Disclosure Bulletin, Gettering of Impurities from Semiconductor Materials, Kastl et al, Vol. 12, No. 11, April 1970, p. 1983.

SUMMARY OF THE INVENTION

We have discovered that when single crystal silicon is reactive ion etched its surface is altered or damaged in some fashion and, as a consequence, when silicon dioxide is grown thereon, it grows at a rate which varies with the degree of alteration or damage of the single crystal silicon, specifically growing thicker as the degree of alteration or damage increases.

As a consequence, if ion implantation is conducted, the doping level achieved will vary in an unpredictable fashion since lower doping levels will result in areas where thicker silicon dioxide is grown, i.e., over the damaged or altered areas.

In accordance with the present invention a sacrificial silicon dioxide layer is grown on the altered or damaged single crystal silicon area(s) which has/have been subjected to reactive ion etching, thereby converting the altered or damaged single crystal silicon area(s) to silicon dioxide. The sacrificial silicon dioxide is then removed by chemical etching to expose "virgin" single crystal silicon. When a base screen silicon dioxide layer is grown on the virgin single crystal silicon it grows at the same rate, and to the same thickness, as on single crystal silicon which has not been subjected to reactive ion etching.

Ion implantation of the desired base dopant can be accomplished through the base screen silicon dioxide layer at very low energy levels and base doping is accomplished with minimal variation from wafer to wafer in the same run, from run to run and from site to site on the same wafer.

One major object of the present invention is to lower variations in base doping in semiconductor fabrication processes.

Another object of the present invention is to reduce variations in the thickness of silicon dioxide layers grown on a semiconductor substrate during fabrication thereof.

Still another object of the present invention is to provide extremely precise control over junction depth in a method for fabricating bipolar transistors.

These and other objects of the present invention will become clear from the following discussion of the present invention.

DESCRIPTION OF THE PREFERRED EMBODIMENTS

Figure 1A:
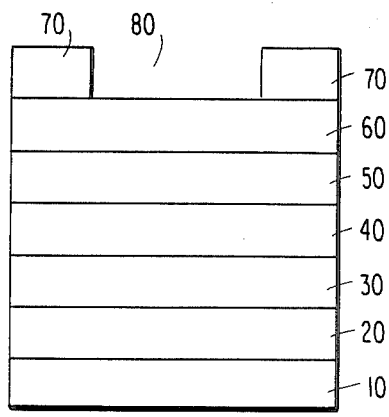
FIG. 1(a) to FIG. 1(f) are cross-sectional schematic representations of a method for fabricating a bipolar transistor in accordance with the present invention. The FIGs. are not to scale.

In the fabrication of bipolar transistors, normally reactive ion etching is used to define regions in a silicon substrate that will be the emitter and base regions of the bipolar transistor. Typically, reactive ion etching is conducted through various layers such as a silicon nitride layer, a silicon dioxide layer and a polysilicon layer down to the single crystal silicon substrate of the bipolar transistor and, to insure complete removal of the polysilicon in areas that will be the emitter and base regions, over-etching is conducted into the single crystal silicon substrate.

The reason for this over-etching is that the polysilicon layer itself has been subjected to a total dopant implant and, if the polysilicon layer is not completely removed over what will be the emitter and base regions of the bipolar transistor, during heat cyclings involved in fabrication of the bipolar transistor undesired dopant, typically boron, will be introduced into the emitter and base regions.

We have discovered that as a consequence of such overetching, the surface of the single crystal silicon substrate becomes altered or damaged in some form so that when silicon dioxide is grown thereon it grows at a rate different than that on an otherwise identical single crystal silicon which has not been subjected to reactive ion etching.

Hereafter, for brevity, this alteration or change in the character of single crystal silicon which has been subjected to reactive ion etching as compared to single crystal silicon not subjected to reactive ion etching will be referred to as "damage". While we are not sure of the exact nature of the damage, nonetheless it alters the response of the single crystal silicon to the growth of silicon dioxide thereon.

Hereafter, for purposes of brevity, the process of the pesent invention will be explained with reference to the formation of the base region of a bipolar transistor and a base screen silicon dioxide layer will merely be referred to as a screen oxide layer.

The consequences of such damage to the single crystal silicon substrate are far reaching, as will now be explained. First, if one attempts to grow silicon dioxide on the single crystal silicon substrate, e.g., a screen oxide layer, the desired screen oxide layer thickness will be achieved in areas which have not been subjected to reactive ion etching, but a thicker screen oxide layer will result in areas which have been subjected to reactive ion etching, i.e., the screen oxide thickness will vary depending upon the degree of reactive ion etching over-etch and the damage resulting therefrom. This thickness can vary from run to run, from wafer to wafer and from site to site on a single wafer.

As a consequence of the variations in screen oxide thickness, any subsequent ion implantation and diffusion will result in a lower doping level in areas where the screen oxide is thicker, i.e., in areas where reactive ion etching has resulted in damage, as compared to areas where reactive ion etching has not resulted in damage. As is well known in the art, a screen oxide layer is necessary to protect the base region against the introduction of heavy atoms which might be present in the ion implanter, i.e., the screen oxide layer traps large ions such as heavy metals, e.g., aluminum, copper, etc., but allows the desired ions, e.g., boron, phosphorus, arsenic, etc., to pass therethrough.

A further important problem which results from variations in screen oxide thickness is variations in junction depth. Obviously a shallow junction is desired; however, if the screen oxide layer is too thick the junction can be too shallow and when the emitter is formed it potentially could short the junction. For this additional reason, precise control of screen oxide thickness is needed.

In accordance with the present invention, after reactive ion etching has been completed and damage has resulted in the single crystal silicon, a sacrificial layer of silicon oxide is grown to consume the single crystal silicon which has been damaged by the reactive ion etching, the same is then removed by a wet etching, thereby removing the damaged single crystal silicon, whereafter the desired screen oxide is grown on top of the exposed, undamaged single crystal silicon.

In accordance with the present invention, silicon dioxide thickness variations are virtually eliminated as are unacceptable variations in base doping levels, i.e., bipolar transistors can be fabricated having a base doping variation of less than ±20% on a consistent basis from wafer to wafer in different runs, from site to site on a wafer in the same run and from wafer to wafer in the same run, which base doping variation is commercially acceptable. For example, for a target boron doping level of $4 \times 10^{12}$ atoms of boron per square centimeter, we are able to consistently achieve base doping levels of 3.2 to $4.8 \times 10^{12}$ atoms of boron per square centimeter.

The proces of the present invention will now be illustrated with reference to the attached drawings which are a cross-sectional, schematic representation of the process of the present invention. As earlier indicated, the drawings are not to scale; like numerals are used to indicate like elements in the drawings.

The substrate of the bipolar transistor of the present invention can be selected from those as are conventionally used in the art. As a practical matter, the substrate is normally single crystal silicon of p-type conductivity, normally having a resistivity of about 10 to about 20 ohm-cm and a thickness of about 20 mils. It can be fabricated by conventional techniques such as pulling from a melt containing the desired impurity concentration and then slicing the pulled member into a plurality of wafers which are cut, lapped and chemically polished to the desired thickness.

As shown in FIG. 1(a), normally in the single crystal silicon substrate 10 an n+ region 20 is typically formed by diffusion through a mask of the desired n type impurity, e.g., arsenic, to a sheet resistance of about 10 ohms/sq.

Region 20 will form the subcollector region of the bipolar transistor.

Following the above procedure, as shown in FIG. 1(a), normally a n− epitaxial layer 30 which will form the collector of the bipolar transistor is grown on the n+ subcollector in a conventional manner. For example, the epitaxial layer is conveniently grown by the decomposition of dichlorosilane. Since the n− epitaxial layer 30 will assume the crystalline nature of the n+ subcollector 20, it will also be single crystal silicon and for discussion herein is considered part of the single crystal silicon substrate.

Following growth of the n− epitaxial layer 30, an intrinsic polysilicon region 40 is chemically vapor deposited on the n− epitaxial layer 30 via the decomposition of SiH$_4$ at about 650° C. Generally the surface of the polysilicon layer 40 is then thermally oxidized with steam at approximately 925° C. for about 60 minutes to convert a portion of the same to silicon dioxide, whereafter boron is implanted into the polysilicon layer 40 at 90 Kev but not, of course, into the n− epitaxial layer 30. Thereafter, silicon dioxide is further grown by a chemical vapor deposition, using SiH$_4$ and O$_2$ at about 400° C., to the desired thickness to yield "composite" silicon dioxide layer 50 (since both layers are silicon dioxide of essentially the same nature they are merely shown as a single layer 50 in the FIGs).

Typically, then, a silicon nitride layer is grown by chemical vapor deposition, using SiCl$_2$H$_2$ and NH$_3$ at about 800° C., to yield silicon nitride layer 60.

After the above procedure a conventional positive photoresist is applied to the silicon nitride laYer, exposed through a mask in a conventional manner and wet etched in a conventional manner to remove the positive photoresist in area 80, leaving positive photoresist in areas 70, thereby defining an opening through which subsequent procedures will be conducted. The device at this stage is as shown in FIG. 1(a).

Figure 1B:
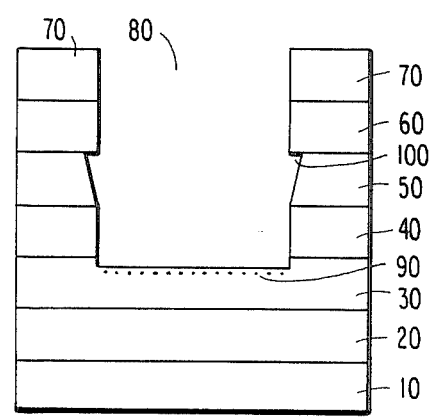

With reference to FIG. 1(b) silicon nitride layer 60 is etched away under opening 80 using conventional reactive etching in CF$_4$.

Following the above processing, normally silicon dioxide layer 50 is removed by wet etching using buffered HF in a conventional manner. Since a wet etch is involved, some undercutting does occur as shown by areas 100 in FIG. 1(b).

Conventional reactive ion etching is then conducted using CF$_4$, whereby polysilicon layer 40 is removed in opening 80 as shown in FIG. 1(b). This is accomplished at about 35 microns pressure and a power of about 700 watts.

Since it is critical to insure that all polysilicon over what is to be the base region of the bipolar transistor is removed, over-etching is conducted into the single crystal n$^-$ epitaxial layer 30, resulting in damaged area 90 as shown in FIG. 1(b).

While not to be construed as limitative, so as to be absolutely sure that polysilicon layer 40 in opening 80 is totally removed, normally we conduct over-etching to a depth of up to about 500 Å. However, the amount of over-etch can be about 200 to about 1,000 Å depending on several parameters, including the size, shape and geometry of the silicon being subjected to reactive ion etching. Obviously, the less the amount of over-etch the better and, as a consequence, an over-etch to a lesser depth could be used, but since it is mandatory to remove polysilicon 40 in opening 80, we generally prefer to build in a safety factor and over-etch to about a 500 Å depth. Over-etching to a greater depth could be used, but normally this is unnecessary. The device at this stage is as shown in FIG. 1(b).

Usually reactive ion etching using CF$_4$ through the polysilicon layer 40 is terminated by comparison to a control wafer which is placed in the reactive ion etching apparatus, i.e., a polysilicon wafer. When the polysilicon wafer which is otherwise identical in composition and thickness to polysilicon layer 40 is consumed, reactive ion etching through the polysilicon layer 40 is also completed.

Thereafter, reactive ion etching is merely conducted for a short period of time, for example, on the order of a few minutes to over-etch into the n$^-$ epitaxial region 30.

The above processing steps are all conventional and well known in the art. The following steps represent the essential features of the invention.

The first step of the present invention is to remove any damage that might have occurred in the n$^-$ epitaxial layer 30; in accordance with our invention, we do this by converting single crystal silicon in the n$^-$ epitaxial layer 30 into a sacrificial silicon dioxide layer. The sacrificial silicon dioxide layer is grown to a depth to insure that all damage to the single crystal n$^-$ epitaxial layer is removed. Normally, there is about a 2:1 ratio between the thickness of the sacrificial silicon dioxide formed and the amount of single crystal silicon consumed, e.g., to form a sacrificial silicon dioxide layer 500 Å thick, we consume on the order of about 250 Å of single crystal silicon.

Figure 1C:
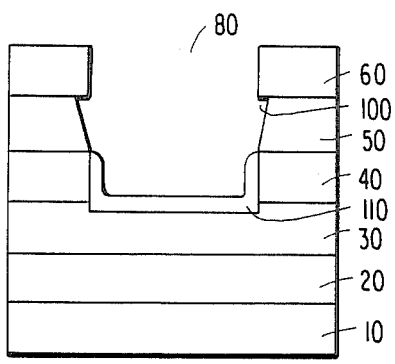

It is obviously impossible to precisely delineate the amount of sacrificial silicon dioxide which is grown since this will depend on the amount of damage which has occurred in the single crystal silicon. We typically, however, for safety purposes, grow a sacrificial silicon dioxide layer about 500 Å thick, thereby removing 250 Å of silicon. We have achieved the results of the present invention by growing a sacrificial silicon dioxide layer as little as 100 Å thick, thereby consuming about 50 Å of single crystal silicon, but currently feel that the sacrificial silicon dioxide layer grown should be at least about 200 Å thick (about 100 Å of single crystal silicon consumed) for safety purposes. The area of sacrificial silicon dioxide grown in accordance with the present invention is shown by 110 in FIG. 1(c). Convenient conditions are wet oxidation at 800° C. Silicon dioxide will, of course, also grow on polysilicon layer 40, as shown in FIG. 1(c).

The depth of damage is normally determined empirically, i.e., we set proposed reactive ion etching conditions and then we process in accordance with the present invention up to and including growth of the sacrificial oxide layer. We then wet etch off the sacrificial oxide layer and grow the screen oxide layer. We grow a screen oxide layer on an otherwise identical single crystal silicon wafer which has not been subjected to reactive ion etching. If growth of the screen oxide layer per the present invention is the same as that on the single crystal wafer which has not been subjected to reactive ion etching, we know that all damage has been removed.

Based on our experience to date, using a conventional reactive ion etching in CF$_4$, usually the maximum depth of the damage is on the order of about 200 to about 250 Å and typically less; accordingly, if a 500 Å thick sacrificial oxide layer is grown, the damage is completely removed. Although we earlier exemplified reactive ion etching at about 35 microns pressure and at a power of about 700 watts, damage is also obtained at other CF$_4$ pressures and at other powers and with other reactive ion etching gases, e.g., SF$_6$/Cl$_2$.

Following the growth of the sacrificial silicon dioxide layer, it is then removed by a wet etching procedure, in a dilute HF solution, though as one skilled in the art will appreciate, other wet etchants can be used, such as buffered HF. Conveniently etching is at room temperature. Using a dilute aqueous HF solution, the etch rate is normally on the order of about 150 to about 200 Å per minute.

Figure 1D:
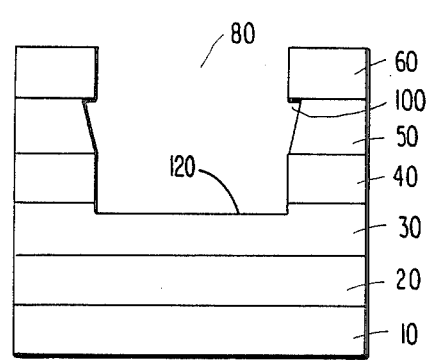

Following removal of the sacrificial oxide, virgin or undamaged single crystal silicon is exposed as represented by area 120 in FIG. 1(d).

Figure 1E:
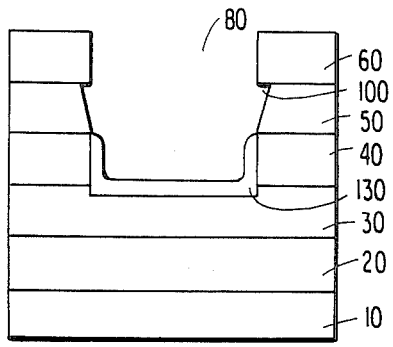

The next step according to the process of the present invention is to grow the screen oxide layer in accordance with 1 the present invention. The thin screen oxide layer, 50 to 500 Å±10%, should be uniform in thickness, reproducible from run to run and wafer to wafer, and will have an oxide thickness essentially the same as an oxide layer grown on a virgin single crystal silicon wafer, i.e., one which has not been subjected to reactive ion etching. This is done in a conventional manner by thermal oxidation, resulting in screen oxide layer 130 as shown in FIG. 1(e). Silicon dioxide will, of course, also grow on polysilicon layer 40, as shown in FIG. 1(c). For example, in our application a screen oxide layer about 180 Å thick is obtained by a wet oxidation for 30 minutes at 800° C.

All of the following steps are conventional and well known in the art.

Following the above procedure, a conventional base region is ion implanted through screen oxide layer 130 in a conventional manner at 15 Kev using boron, to result in base region 140, whereafter we generally remove the screen oxide layer 130 by a conventional wet etch in, e.g., dilute HF or buffered HF, in a conventional manner.

Figure 1F:
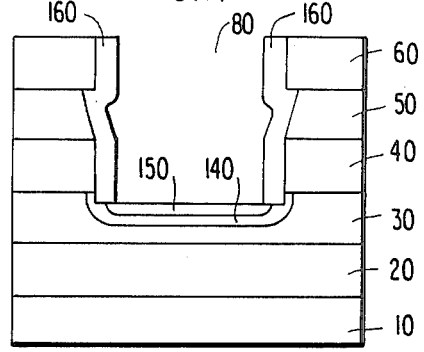

Then the emitter region 150 is formed within the intrinsic base region using a sidewall technique similar to that described in U.S. Pat. Nos. 4,318,751 Horng or 4,319,932 Jambotkar. The sidewalls are shown in FIG. 1(f) as 160; since the sidewalls 160 are conveniently formed by conventional chemical vapor deposition of silicon dioxide, they are shown as conformal in FIG. 1(f). The emitter region 150 is formed by ion implantation in a conventional manner using arsenic at 75 Kev. The sidewalls 160 are permitted to remain so that the emitter metallurgy will not contact the base. The device at this stage is shown in FIG. 1(f). If desired, of course, a second screen oxide layer can be grown for the emitter implantation. Since this is optional, it is not shown in FIG. 1(f).

Finally, electrical contacts are made to various elements of the bipolar transistor in a conventional manner.

Having thus generally described the present invention, the following working example is offered; explanation is with reference to the drawings.

EXAMPLE

The structure as shown in FIG. 1(a) was formed in a conventional manner as earlier described with p−-type single crystal substrate 10 and the n+ subcollector 20. The n− epitaxial layer 30 was about 1.5 microns thick, the polysilicon layer 40 was about 3,000 Å thick, the silicon dioxide layer 50 was about 2,000 to about 3,000 Å thick and the silicon nitride layer 60 was about 1,000 Å thick. Opening 80 was formed in conventional positive photoresist layer 70 in a conventional manner.

Reactive ion etching was then conducted through silicon nitride layer 60 in $CF_4$ in a conventional manner. Since reactive ion etching is anisotropic, this resulted in a clean removal of silicon nitride layer 60.

Silicon dioxide layer 50 was then wet etched away using a dilute buffered aqueous HF solution which is very selective for silicon dioxide, etching inherently terminating at the upper surface of polysilicon layer 40 and resulting, since a wet etch was used, in some undercutting as shown by 100.

Following the above procedure, reactive ion etching was again conducted using $CF_4$ through polysilicon layer 40 at a pressure of 35 microns and a power of 700 watts; over-etching was conducted into the n− epitaxial layer 30 at the same conditions to a depth which we estimated to be about 500 Å, resulting in damage 90 as shown in FIG. 1(b). It took about 15 minutes to etch through the 3,000 Å polysilicon layer down to the n− epitaxial layer, and about 2 ½ minutes to over-etch into the n− epitaxial layer to a depth of 500 Å.

At this stage photoresist 70 as shown in the FIGs. was stripped in a conventional manner.

The sacrificial silicon dioxide layer of the present invention was then grown by converting the n− epitaxial layer 30 to silicon dioxide to a depth of 500 Å in a conventional manner at 800° C., wet atmosphere, about 100 minutes. This resulted in sacrificial silicon dioxide layer 110 as shown in FIG. 1(c).

Sacrificial silicon dioxide layer 110 as shown in FIG. 1(c) was then removed by wet etching in dilute HF (10 parts by volume $H_2O$, 1 part by volume HF) at room temperature (20° C.) over a 3½ minute period (etch rate of about 150 to about 200 Å per minute).

This resulted in exposing virgin (undamaged) n− epitaxial layer as shown by 120 in FIG. 1(d). The total consumption of the n− epitaxial layer was about 750 Å, i.e., about a 500 Å over-etch in combination with 250 Å of single crystal silicon being converted to sacrificial silicon dioxide.

Following processing above, screen silicon dioxide layer 130 as shown in FIG. 1(e) was grown to a total thickness of about 180 Å in a conventional manner at 800° C., wet atmosphere, the growth being conducted for 25 minutes.

Thereafter, conventional base and emitter ion implantations and wiring were performed.

While there have been described what are at present considered to be the preferred embodiments of this invention, it will be obvious to those skilled in the art that various changes and modifications can be made therein without departing from the invention, and it is, therefore, intended to cover all such changes and modifications as fall within the true spirit and scope of the invention.

What is claimed is:

1. The method for the reproducible fabrication of bipolar transistors having a base doping variation of less than 20% comprising:
   (a) forming a polysilicon base contact bipolar transistor up to the point just prior to the intrinsic base-emitter formation;
   (b) reactive ion etching the intrinsic base-emitter opening through said polysilicon base contact layer down to and into the single crystal silicon body thereunder, whereby the surface of the single crystal body is damaged;
   (c) thermally growing a silicon dioxide layer on the exposed and damaged surface of the single crystal silicon body to convert the damaged silicon surface thereof into silicon dioxide;
   (d) removing the silicon dioxide layer by chemical etching to expose undamaged single crystal silicon;
   (e) forming a reproducible, uniform, thin screen silicon dioxide layer of a thickness of 50 Å to 500 Å±10% on the thus exposed single crystal silicon;
   (f) forming the intrinsic base region having the said base doping by ion implantation through the screen silicon dioxide layer;
   (g) forming the emitter region within the intrinsic base region; and
   (h) making electrical contact to the various elements of the bipolar transistor.

2. The method of claim 1, wherein any reactive ion etching is in $CF_4$.

3. The method of claim 1, wherein etching into the single crystal silicon body of step (b) is to a depth of about 200 to about 1,000 Å.

4. The method of claim 1, wherein the thermally growing of step (c) converts about 100 Å of the single crystal silicon body to about 200 Å of silicon dioxide.

5. The method of claim 1, wherein the thermally growing of step (c) converts about 250 Å of the single crystal silicon body to about 200 Å of silicon dioxide.

6. The method of claim 1, wherein the removing of step (d) is in dilute HF.

* * * * *